United States Patent
Lei

(10) Patent No.: US 9,414,510 B2
(45) Date of Patent: Aug. 9, 2016

(54) ELECTRONIC CARD CONNECTOR AND ELECTRONIC DEVICE USING SAME

(71) Applicant: ShenZhen Goldsun Network Intelligence Technology Co., Ltd., Shenzhen (CN)

(72) Inventor: Qian Lei, Shenzhen (CN)

(73) Assignee: ShenZhen Goldsun Network Intelligence Technology Co., Ltd., ShenZhen (CN)

( * ) Notice: Subject to any disclaimer, the term of this patent is extended or adjusted under 35 U.S.C. 154(b) by 0 days.

(21) Appl. No.: 14/576,698

(22) Filed: Dec. 19, 2014

(65) Prior Publication Data

US 2016/0095240 A1    Mar. 31, 2016

(30) Foreign Application Priority Data

Sep. 25, 2014   (CN) .......................... 2014 1 0496305

(51) Int. Cl.
*H05K 7/20* (2006.01)
*H05K 5/02* (2006.01)
*H05K 5/00* (2006.01)

(52) U.S. Cl.
CPC ............ *H05K 5/0295* (2013.01); *H05K 5/0069* (2013.01); *H05K 5/0239* (2013.01); *H05K 5/0247* (2013.01)

(58) Field of Classification Search
CPC .................................................... H05K 5/0295
USPC .......................................................... 361/754
See application file for complete search history.

(56) References Cited

U.S. PATENT DOCUMENTS

| 8,902,602 | B2* | 12/2014 | Wang | H05K 7/1461 361/737 |
| 8,947,885 | B2* | 2/2015 | Wu | G06F 1/1613 361/679.31 |
| 2013/0286608 | A1* | 10/2013 | Liang | H05K 7/1402 361/754 |

* cited by examiner

*Primary Examiner* — Anthony Q Edwards
(74) *Attorney, Agent, or Firm* — ScienBiziP, P.C.

(57) ABSTRACT

An electronic card connector includes a tray, at least one latching member, a push rod and an ejection assembly. The tray defines a defined space for accommodating an electronic card and at least one notch. Each latching member comprises at least one fixing portion fixed to a housing and a bulge. Each bulge receives in one of the at least one notch to detachably engage the tray with the housing. The push rod includes a first hook. The ejection assembly includes a connecting rod having a second hook and an expansion bracket rotatably coupled to the connecting rod and resisting the tray. When the second hook is engaged with the first hook, the tray is engaged with the housing. When the first hook is disengaged from the second hook, the tray is driven to disengage from the housing by an elastic restoring force of the expansion bracket.

20 Claims, 4 Drawing Sheets

ELECTRONIC CARD CONNECTOR AND
ELECTRONIC DEVICE USING SAME

FIELD

The subject matter herein generally relates to an electronic card connector and an electronic device using same.

BACKGROUND

Electronic card connector, such as Subscriber Identity Model card (SIM card), Secure Digital Memory card (SD card) or like can be inserted into an electronic device, so that the electronic device can communicate with other electronic devices or store information.

BRIEF DESCRIPTION OF THE DRAWINGS

Many aspects of the present disclosure are better understood with reference to the follow drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
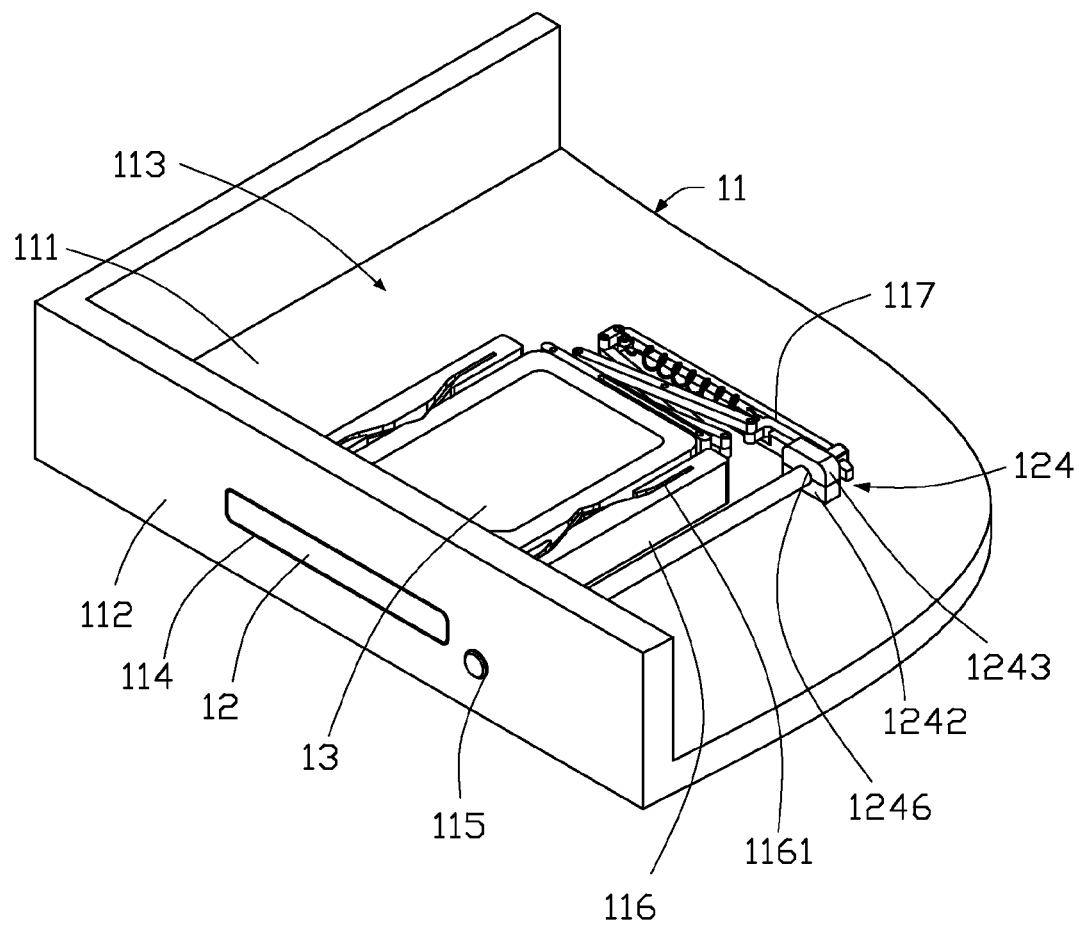
FIG. 1 is a partial isometric view of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series and the like.

Figure 2:
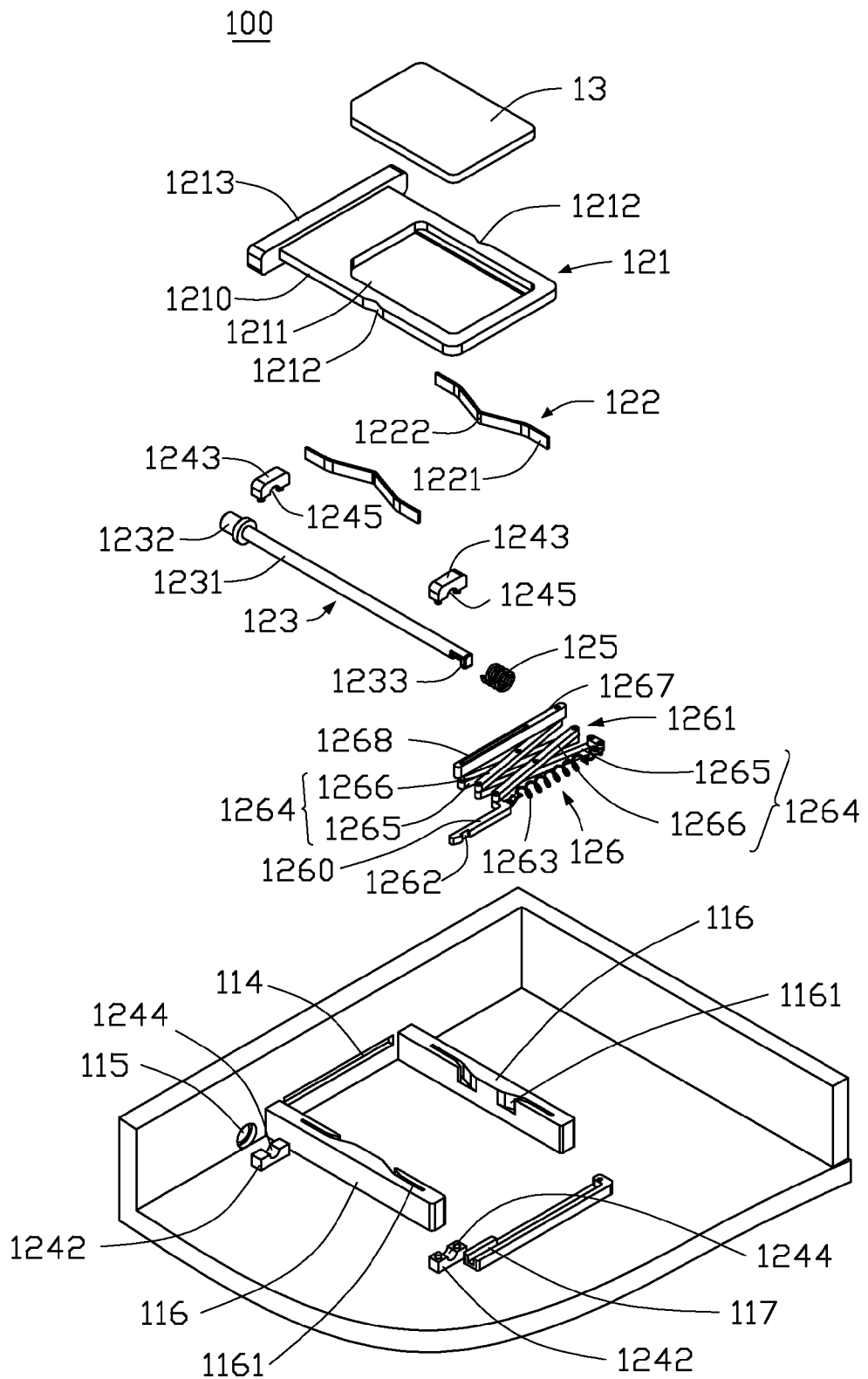
FIG. 2 is an exploded isometric view of an embodiment of the electronic device shown in FIG. 1.

FIGS. 1 and 2 show an electronic device 100. The electronic device 100 can be a mobile phone, or a computer includes, but not limited to, a portable computer, or a tablet computer, or a desktop computer. The electronic device 100 can include a housing 11 and an electronic card connector 12. The electronic device 100 can also include other functional modules to fulfill different functions; however, it is not shown and specifically described for simplification.

The housing 11 can include a bottom plate 111, a peripheral sidewall 112 and other peripheral sidewalls (not shown). The bottom plate 111, the peripheral sidewall 112 and the other peripheral sidewalls can cooperatively define a receiving space 113. The electronic card connector 12 can be received in the receiving space 113. The peripheral sidewall 112 can define an opening 114 and a first through hole 115 near the opening 114. The opening 114 and the first through hole 115 can both interconnect with the receiving space 113.

The electronic card connector 12 can include a tray 121, at least one latching member 122, a push rod 123, at least one fixing member 124, a return member 125 and an ejection assembly 126.

The tray 121 can receive in the receiving space 113 and further cover the opening 114. In detail, the tray 121 can include a tray body 1210 and an end cover 1213 protruding from one end of the tray body 1210. When in assembly, the tray body 1210 can pass through the opening 114 and then receive in the receiving space 113, and the end cover 1213 can thus receive in the opening 114 to cover the opening 114.

The tray body 1210 can define a defined space 1211 located on one side of the tray body 1210 away from the bottom plate 111. The defined space 1211 can be used to accommodate an electronic card 13. The electronic card 13 can be a Subscriber Identity Model card (SIM card), Secure Digital Memory card (SD card) or other suitable electronic card.

The tray body 1210 can include two sidewalls 1214. The two sidewalls 1214 can substantially parallel with each other. The tray body 1210 can further define two notches 1212 located on the two sidewalls 1214 of the tray body 1210

Each latching member 122 can latch the tray 121 with the housing 11. Each latching member 122 can include at least one fixing portion 1221 and a bulge 1222. The at least one fixing portion 1221 can be fixed to the bottom plate 111 respectively. The bulge 1222 can receive in the notch 1212 to detachably engage the tray 121 with the housing 11.

In at least one embodiment, the bottom plate 111 can further include at least one limited wall 116 protruded therefrom. The at least one fixing portion 1221 can be fixed to one of the at least one limited wall 116. In detail, each limited wall 116 can define a slot 1162. The at least one fixing portion 1221 can receive in the one slot 1162 to fix the latching portion 122 to the one of at least one limited wall 116.

In this embodiment, the electronic card connector 12 can include two latching members 122. The bottom plate 111 can further include two limited walls 116 protruded therefrom. The two limited walls 116 can be located on two sides of the tray body 1210. Each latching member 122 can be fixed to the one limited walls 116.

The push rod 123 can include a push rod body 1231, a pressing portion 1232 and a first hook 1233. The pressing portion 1232 and the first hook 1233 can be located on the two ends of the push rod body 1231. The pressing portion 1232 can pass through the though hole 115 and protrudes out from the housing 11.

The at least one fixing member 124 can limit the movement of the push rod 123, thus, the push rod 123 can move along a direction parallel with an axis of the push rod 123. Each fixing member 124 can include a base 1242 and a top cover 1243. The base 1242 can define a first slide groove 1244. The top cover 1243 can define a second slide groove 1245. The second slide groove 1245 can face the first slide groove 1244. When the top cover 1243 covers the base 1242, the first slide groove 1244 and the second slide groove 1245 can cooperatively form a second through hole 1246. The diameter of the second through hole 1246 can be substantially equal to that of the push rod body 1231. The axis of the second through hole 1246 can be coincided with that of the first through hole 115.

In at least one embodiment, the base 1242 and the top cover 1243 can be made of same material.

In at least one embodiment, the base 1242 can be fixed to the top cover 1243.

In this embodiment, the electronic card connector 12 can include two fixing members 124. The two fixing members 124 can be located on the axis of the first through hole 115. One of the two fixing members 124 can be close to the peripheral sidewall 112. The other of the two fixing members 124 can be away from the peripheral sidewall 112.

The return member 125 can drive the push rod 123 to return its initial position. In this embodiment, the return member 125 can be a spring and sleeve on the push rod body 1231. One end of the return member 125 can resist the interior of the peripheral sidewall 112, and the other end of the return member 125 can resist the fixing member 124 close to the peripheral sidewall 112.

The ejection assembly 126 can be located on one end of the tray 121 away from the opening 114. The ejection assembly 126 can include a connecting rod 1260 and an expansion bracket 1261. An axis of the connecting rod 1260 can be substantially perpendicular to that of the push rod 123. The connecting rod 1260 can have a second hook 1262 located on one end of the connecting rod 1260 close to the push rod 123. The second hook 1262 can engage with the first hook 1233. When the second hook 1262 engages with the first hook 1233, the expansion bracket 1261 is in a compressed state. When the second hook 1262 disengages with the first hook 1233, an elastic restoring force of the expansion bracket 1261 can drive the tray 121 to move along a direction close to the peripheral sidewall 112 and further protrude from the opening 114.

The bottom plate 111 can have a guide groove 117. An extension direction of the guide groove 117 is substantially parallel with the peripheral sidewall 112. The connecting rod 1260 can stretch into the guide groove 117 and further slide therein with the guide of the guide groove 117.

The expansion bracket 1261 can include a spring 1263 and at least one X-shaped bracket 1264. The spring 1263 can couple two ends of the at least one X-shaped bracket 1264 away from the peripheral sidewall 112.

In this embodiment, the expansion bracket 1261 can include two X-shaped brackets 1264. The one X-shaped bracket 1264 can be close to the tray 121, and the other X-shaped bracket 1264 can be away from the tray 121. Each X-shaped bracket 1264 can include a first connecting rod 1265 and a second connecting rod 1266. The first connecting rod 1265 can be rotatably coupled to the middle of the second connecting rod 1266. The second connecting rod 1266 can be rotatably coupled to the middle of the first connecting rod 1266. Thus, the X-shaped bracket 1264 is formed by the first connecting rod 1265 and the second connecting rod 1266. The first connecting rod 1265 of the one X-shaped bracket 1264 can be rotatably coupled to the second connecting rod 1266 of the other X-shaped bracket 1264, and the second connecting rod 1266 of the one X-shaped bracket 1264 can be rotatably coupled to the first connecting rod 1265 of the other X-shaped bracket 1264.

The expansion bracket 1261 can include a resist rod 1267. The resist rod 1267 can be rotatably coupled to the one X-shaped bracket 1264. The resist rod 1267 can be substantially parallel with the peripheral sidewall 112 and resist the one end of the tray 121 away from the peripheral sidewall 112. In detail, the resist rod 1267 can define a third guide groove 1268. One end of the first connecting rod 1265 of the one X-shaped bracket 1264 can be rotatably coupled to the third slide groove 1268, and one end of the second connecting rod 1266 of the one X-shaped bracket 1264 can be rotatably coupled to the one end of the resist rod 1267 away from the push rod 123.

In at least one embodiment, the one end of the other X-shaped bracket 1264 away from the peripheral sidewall 112 and away from the push rod 123 can be fixed to the bottom plate 111, and the other end of the other X-shaped bracket 1264 away from the peripheral sidewall 112 and close to the push rod 123 can be fixed to the one end of the connecting rod 1260 away from the push rod 123.

Figure 3:
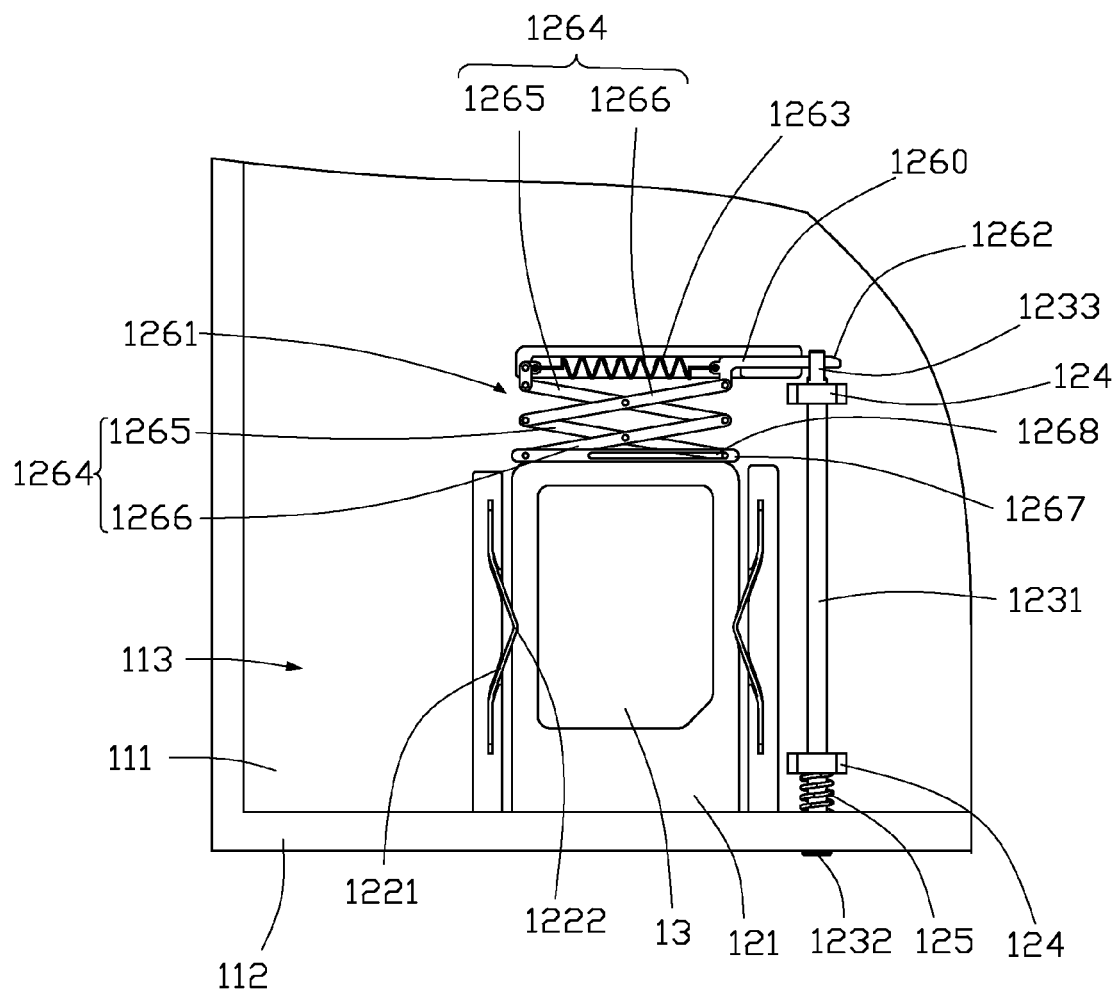
FIG. 3 is a diagrammatic view of an embodiment of the electronic device shown in FIG. 1 in a first state.

Referring to FIG. 3, when in assembly, the at least one latching member 122 can be fixed the at least one limited wall 116 respectively; the expansion bracket 1261 can be coupled to one end of the connecting rod 1260 away from the push rod 123; the connecting rod 1260 can be received in the guide groove 117; the at least one base 1242 can be fixed to the bottom plate 111; the return member 125 can be sleeved on the push rod body 1231; the push rod 123 can be received in the at least one first slide groove 1244, thus the first hook 1233 of the push rod 1233 can be engaged with the second hook 1262 of the connecting rod 1260. The return member 125 can be located between the base 1244 close to the peripheral sidewall 112 and the peripheral sidewall 112, and the pressing portion 1232 of the push rod 123 can be pushed to pass through the first through hole 115 and protruded from the housing 11. The tray body 1210 can be pushed to pass through the opening 114 and received in the receiving space 113 thus to resist the expansion bracket 1261. The end cover 1213 can cover the opening 114. At this moment, the spring 1263 can be in a stretched state, and the electronic card connector 12 can be in a locked state.

Figure 4:
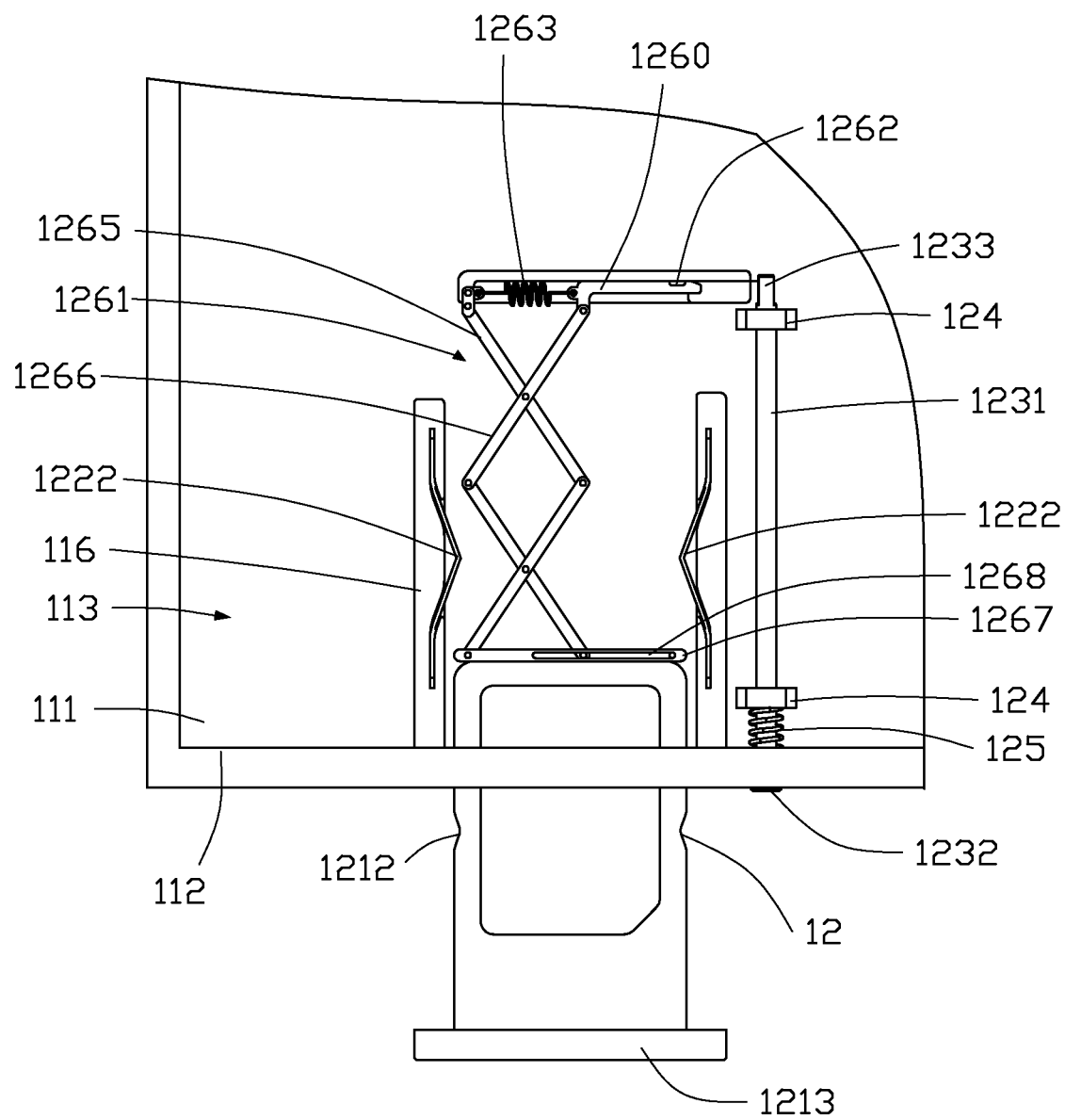
FIG. 4 is a diagrammatic view of an embodiment of the electronic device shown in FIG. 1 in a second state.

Referring to FIG. 4, if one wants to take out the electronic card 13 from the defined space 1211, or put a new electronic card into the defined space 1211, an external pressure applied on the pressing portion 1232 can drive the push rod 123 to move along a direction perpendicular to the peripheral sidewall 112 and away from the peripheral sidewall 112. The first hook 1233 can gradually disengage from the second hook 1262. When the first hook 1233 disengages from the second hook 1262, the return member 125 can be in a compressed state. When there is no external pressure applied on the pressing portion 1232, an elastic restoring force of the return member 125 can drive the push rod 123 to return its initial position. When the first hook 1233 disengages from the second hook 1262, an elastic restoring force of the spring 1263 can drive the expansion bracket 1261 to extend along a direction perpendicular to the peripheral sidewall 112 and close to the peripheral sidewall 112 and further drive the tray 121 to overcome the resistance between the at least one latching member 122 and the tray 121, and further move out the opening 114.

The embodiments shown and described above are only examples. Many details are often found in the art. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. An electronic device comprising:
  a housing comprising a bottom plate and a peripheral sidewall, the bottom plate and the peripheral sidewall defining a receiving space, the peripheral sidewall defining an opening and a first through hole near the opening; and
  an electronic card connector comprising:
    a tray defining a defined space for accommodating an electronic card and at least one notch, the tray passing through the opening and being received in the receiving space;
    at least one latching member comprising at least one fixing portion fixed to the bottom plate and a bulge, each bulge receiving in one of the at least one notch to engage the tray with the housing;
    a push rod comprising a first hook and a pressing portion passing through the first through hole; and
    an ejection assembly comprising:
      a connecting rod comprising a second hook; and
      an expansion bracket rotatably coupled to the connecting rod and resisting the tray,
    wherein when the tray is engaged with the housing, the second hook is engaged with the first hook, the expansion bracket is in a compressed state; and
    when first hook of the push rod is driven to disengage from the second hook, the tray is driven to overcome resistance between the at least one bulge and the tray and further move out of the opening by an elastic restoring force of the expansion bracket.

2. The electronic device of claim 1, wherein the bottom plate comprises at least one limited wall protruded therefrom, and the at least one fixing portion of the latching member is fixed to one of the at least one limited wall.

3. The electronic device of claim 2, wherein each limited wall defines a slot, the at least one fixing portion of the latching member receives in the slot to fix the latching portion to the one of at least one limited wall.

4. The electronic device of claim 1, wherein the electronic card connector further comprises at least one fixing member, each fixing member defines a second through hole, the push rod passes through both the first through hole and the second through hole, and slides along a direction of an axis of the push rod in the first through hole and the second through hole.

5. The electronic device of claim 4, wherein each fixing member comprises a base and a top cover, the base defines a first slide groove, the top cover defines a second slide groove, and the second through hole is formed by the first slide groove and the second slide groove.

6. The electronic device of claim 4, wherein a diameter of the second through hole is substantially equal to that of the push rod, and an axis of the second through hole is coincided with that of the first through hole.

7. The electronic device of claim 4, wherein the electronic card connector comprises a return member, the return member sleeves on the push rod and resists between the peripheral sidewall and one of the at least one fixing member close to the peripheral sidewall, when the push rod is driven to slide to a position close to the at least one fixing member, the return member drives the push rod to return its initial position.

8. The electronic device of claim 1, wherein the bottom plate has a guide groove, an extension direction of the guide groove is substantially parallel with the peripheral sidewall, the connecting rod stretches into the guide groove and further slides therein with the guide of the guide groove.

9. The electronic device of claim 1, wherein the expansion bracket comprises a spring and at least one X-shaped bracket, the spring couples two ends of the at least one X-shaped bracket away from the peripheral sidewall, and the at least one X-shaped bracket resists the tray.

10. The electronic device of claim 9, wherein each X-shaped bracket comprises a first connecting rod and a second connecting rod, the first connecting rod is rotatably connected to middle of the second connecting rod, the second connecting rod is rotatably connected to middle of the first connecting rod.

11. The electronic device of claim 9, wherein the expansion bracket comprises a resist rod, the resist rod is rotatably coupled to the at least one X-shaped bracket and resists the tray.

12. An electronic card connector applied to an electronic device comprising a housing comprising a bottom plate and a peripheral sidewall, the bottom plate and the peripheral sidewall defining a receiving space, the peripheral sidewall defining an opening and a first through hole close to the opening; the electronic card connector comprising:
  a tray defining a defined space for accommodating an electronic card and at least one notch, the tray passing through the opening and being received in the receiving space;
  at least one latching member comprising at least one fixing portion fixed to the bottom plate and a bulge, each bulge receiving in one of the at least one notch to engage the tray with the housing;
  a push rod comprising a first hook and a pressing portion passing through the first through hole; and
  an ejection assembly comprising:
    a connecting rod comprising a second hook; and
    an expansion bracket rotatably coupled to the connecting rod and resisting the tray,
  wherein when the tray is engaged with the housing, the second hook is engaged with the first hook, the expansion bracket is in a compressed state; and
  when first hook of the push rod is driven to disengage from the second hook, the tray is driven to overcome resistance between the at least one bulge and the tray and further move out the opening by an elastic restoring force of the expansion bracket.

13. The electronic card connector of claim 12, wherein the electronic card connector further comprises at least one fixing member, each fixing member defines a second through hole, the push rod passes through both the first through hole and the second through hole, and slides along a direction of an axis of the push rod in the first through hole and the second through hole.

14. The electronic card connector of claim 13, wherein each fixing member comprises a base and a top cover, the base defines a first slide groove, the top cover defines a second slide groove, and the second through hole is formed by the first slide groove and the second slide groove.

15. The electronic card connector of claim 13, wherein a diameter of the second through hole is substantially equal to that of the push rod, and an axis of the second through hole is coincided with that of the first through hole.

16. The electronic card connector of claim 13, wherein the electronic card connector comprises a return member, the return member sleeves on the push rod and resists between the peripheral sidewall and one of the at least one fixing member close to the peripheral sidewall, when the push rod is driven to slide to a position, the return member drives the push rod to return its initial position.

17. The electronic card connector of claim 12, wherein the bottom plate has a guide groove, an extension direction of the guide groove is substantially parallel with the peripheral sidewall, the connecting rod stretches into the guide groove and further slides therein with the guide of the guide groove.

18. The electronic card connector of claim 12, wherein the expansion bracket comprises a spring and at least one X-shaped bracket, the spring couples two ends of the at least one X-shaped bracket away from the peripheral sidewall, the at least one X-shaped bracket resists the tray.

19. The electronic card connector of claim 18, wherein each X-shaped bracket comprises a first connecting rod and a second connecting rod, the first connecting rod is rotatably coupled to middle of the second connecting rod, the second connecting rod is rotatably coupled to middle of the first connecting rod.

20. The electronic card connector of claim 18, wherein the expansion bracket comprises a resist rod, the resist rod is rotatably coupled to the at least one X-shaped bracket and resists the tray.

\* \* \* \* \*